United States Patent
Koffmane et al.

(10) Patent No.: US 6,316,972 B1
(45) Date of Patent: Nov. 13, 2001

(54) SLOPE GENERATOR

(75) Inventors: Gerd Koffmane, Althengstett; Alexander Lazar, Calw-Stammheim, both of (DE)

(73) Assignee: Agilent Technologies, Inc., Loveland, CO (US)

(*) Notice: Subject to any disclaimer, the term of this patent is extended or adjusted under 35 U.S.C. 154(b) by 0 days.

(21) Appl. No.: 09/453,771

(22) Filed: Dec. 2, 1999

(30) Foreign Application Priority Data

Dec. 23, 1998 (EP) .................................................. 98124629

(51) Int. Cl.[7] .................................................. H03K 4/06
(52) U.S. Cl. ........................................... 327/132; 327/170
(58) Field of Search ..................................... 327/131, 132, 327/134, 170, 365, 182, 183, 336, 344

(56) References Cited

U.S. PATENT DOCUMENTS

| | | | |
|---|---|---|---|
| 4,228,366 | 10/1980 | Huttemann et al. | 327/336 |
| 5,006,739 | 4/1991 | Kimura et al. | 327/112 |
| 5,311,141 | * 5/1994 | Umeyama et al. | 327/552 |
| 5,742,494 | 4/1998 | Brakus et al. | 363/97 |
| 5,874,837 | * 2/1999 | Manohar et al. | 326/83 |
| 6,028,459 | * 2/2000 | Birdsall et al. | 327/94 |
| 6,121,805 | * 9/2000 | Thamsirianunt et al. | 327/175 |

FOREIGN PATENT DOCUMENTS

| | | |
|---|---|---|
| 0499175A2 | 2/1992 | (EP) . |
| 1 430 397 | 12/1973 | (GB) . |

* cited by examiner

Primary Examiner—Timothy P. Callahan
Assistant Examiner—Linh Nguyen

(57) ABSTRACT

A slope generator generates, in response to an input signal, a slope between a first and a second voltage level of an output voltage at an output node. The slope generator comprises a capacitor coupled to the output node, a first current source for providing a first current to the output node, and a second current source for providing a second current to the output node controlled by a first current switch. A control electrode of a first current path of the first current switch is coupled to and controlled by the input signal, a second current path is coupled to the output node, and the first current switch provides the first and the second voltage levels, or corresponding voltage levels derived therefrom, to the output node.

8 Claims, 4 Drawing Sheets

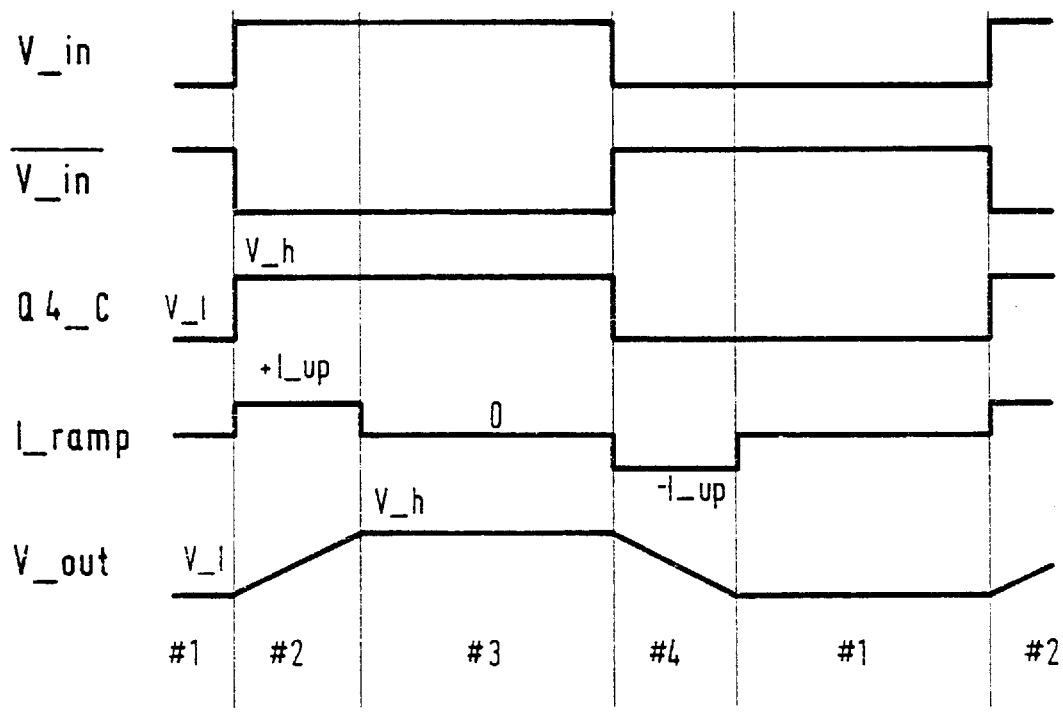

SLOPE GENERATOR

FIELD OF THE INVENTION

The present invention relates to slope generators for generating a slope between a first and a second voltage level.

BACKGROUND OF THE INVENTION

Slope generators (also referenced as waveform, ramp or sawtooth wave generators) are used in several applications for generating signals with a controllable slope. Typically, a current integrating capacitor is charged/discharged to produce a ramp signal.

FIG. 1 depicts a slope generator 10 as known in the art, e.g. a 1DB6 ("Snake") Slope Generator IC as used in the Hewlett-Packard HP8112A. The slope generator 10 comprises a fixed connected current source 20 providing a charge current I_up to load a ramp-capacitor C_ramp from a voltage low level V_l to a voltage high level V_h as output voltage V_out at a node 25. A current source 30 switchable by a current switch 40 (consisting of transistors Q1 and Q2) provides a current I_dn (whereby I_dn>I_up) to discharge the ramp-capacitor C_ramp from voltages V_h to V_l with a discharge current of I_dn–I_up. An input pulse V_in with fast edges at the current switch 40 controls the coupling of the current source 30 to the ramp-capacitor C_ramp. A low-level of the input pulse V_in switches on I_dn and a high level of the input pulse V_in switches off I_dn.

With the current I_dn being turned off, the ramp-capacitor C_ramp will be charged with a constant current I_up (thus generating a rising slope with the slew rate of dV/dt=I_up/C_ramp) until a clamping diode D2 (coupled to a clamping voltage V_cl_h) is taking over this current, thus stopping the charging. With I_dn being turned on, the ramp-capacitor C_ramp will be discharged with a constant current I_dn–I_up (thus generating a falling slope with the slew rate of dV/dt=–(I_dn–I_up)/C_ramp) until a clamping diode D1 (coupled to a clamping voltage V_cl_l) is taking over this current, thus stopping the discharging.

The voltage levels V_l and V_h of the output voltage V_out at the ramp node 25 of the ramp-capacitor C_ramp are derived from the clamping voltages V_cl_l and V_cl_h:

$$V\_l = V\_cl\_l(I\_dn-I\_up, T) - Vf\_D1(I\_dn-I\_up, T) \quad (1a)$$

$$V\_h = V\_cl\_h(I\_up, T) + Vf\_D2(I\_up, T). \quad (1b)$$

The clamping voltage V_cl_l and the forward voltage Vf_D1 at diode D1 are both dependent on the differences between the currents I_dn and I_up and on the temperature T. Accordingly, the clamping voltage V_cl_h and the forward voltage Vf_D2 at diode D2 are both dependent on the current I_up and the temperature T.

The time to charge the capacitor C_ramp and thus the rising time T_rise of the slope generator 10 is:

$$T\_rise = C\_ramp \times \frac{|V\_h - V\_l|}{I\_up}. \quad (2)$$

Accordingly and with I_dn>I_up, the time to discharge the capacitor C_ramp and thus the falling time T_fall of the slope generator 10 is:

$$T\_fall = C\_ramp \times \frac{|V\_h - V\_l|}{|I\_dn - I\_up|}. \quad (3)$$

As apparent from equations (2) and (3), the timing of the slope generator 10 directly depends on the voltage levels V_h and V_l. Therefore, significant effort has to be spent to compensate the thermal and current dependency of the clamping diodes D1 and D2.

Another, even more serious disadvantage of the slope generator 10 of FIG. 1 is the capacitive loading by two clamping diodes (D1 and D2), thus limiting the minimum feasible ramp-capacitance C_ramp_eff, and accordingly, the minimum feasible transition times T_rise and T_fall. This is since the fastest slope (or transition time) is determined by the highest possible charging current and the lowest possible capacitance at the node 25, whereby the capacitance at the node 25 is determined by the capacitor C_ramp and parasitic capacitances. On the other hand, the parasitic capacitance of the clamping diodes D1 and D2 exhibits a strong dependency on the applied voltages, thus resulting in a negative impact on a desired linear slope. Since V_cl_l and V_cl_h represent low impedance nodes, the influence of parasitic capacitance of the clamping diodes D1 and D2 will add fully to the ramp capacitor C_ramp.

SUMMARY OF THE INVENTION

It is an object of the invention to provide an improved slope generator with a more accurate level clamping.

The object is solved by independent claim 1. Preferred embodiments are shown by the dependent claims.

A slope generator according to invention generates, in response to an input signal, a slope between a first and a second voltage level of an output voltage at an output node. The slope generator comprises a capacitor coupled to the output node, a first current source for providing a first current to the output node, and a second current source for providing a second current to the output node controlled by a first current switch. A control electrode of a first current path of the first current switch is coupled to and controlled by an input signal and a second current path is coupled to the output node. The first current switch provides the first and the second voltage levels, or corresponding voltage levels derived therefrom, to the output node.

According to the invention, the first current switch represents a combined current switching/voltage level providing (clamping) circuit, thus diminishing the influence of parasitic capacitance loads at the ramp-node.

In a preferred embodiment, the first current switch comprises two emitter-coupled transistors and a control electrode of the second current path is coupled to the output node. In contrast to the prior art as depicted in FIG. 1, wherein two diodes are connected to a low impedance node, this inventive embodiment provides just one diode connected to a low impedance node, thus allowing faster transition times for given ramp capacitor, charge currents and ramp voltage swings. Thus, the 'clamping principle' is to go—from the voltage levels V_l and V_h—one diode drop down and then one diode drop up again, thus directly transferring V_h and V_l to the ramp node. With matching diodes, all temperature and current dependencies are cancelled out with a very simple circuitry.

The invention allows smaller achievable output transition times, a much simpler design and the good amplitude stability.

BRIEF DESCRIPTION OF THE DRAWINGS

Other objects and many of the attendant advantages of the present invention will be readily appreciated and become better understood by reference to the following detailed description when considering in connection with the accompanied drawings. Features that are or can be built up substantially equally or similarly are referred to with the same reference sign.

FIG. 2B depicts a diagram of currents and voltages for an example of the slope generator 100 of FIG. 2A in operation.

DETAILED DESCRIPTION OF THE INVENTION

Figure 1:
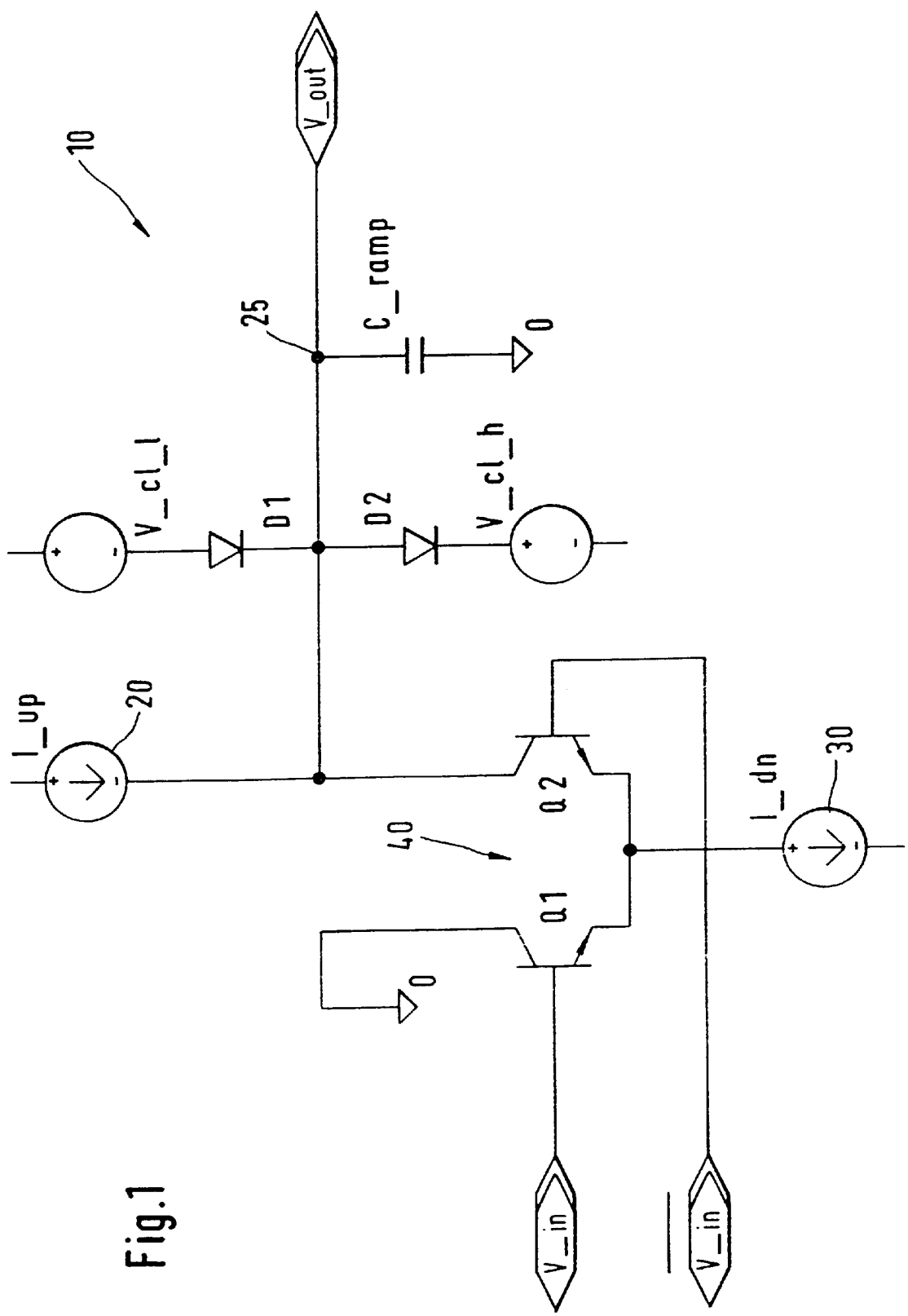
FIG. 1 depicts a slope generator 10 as known in the art.
Figure 2A:
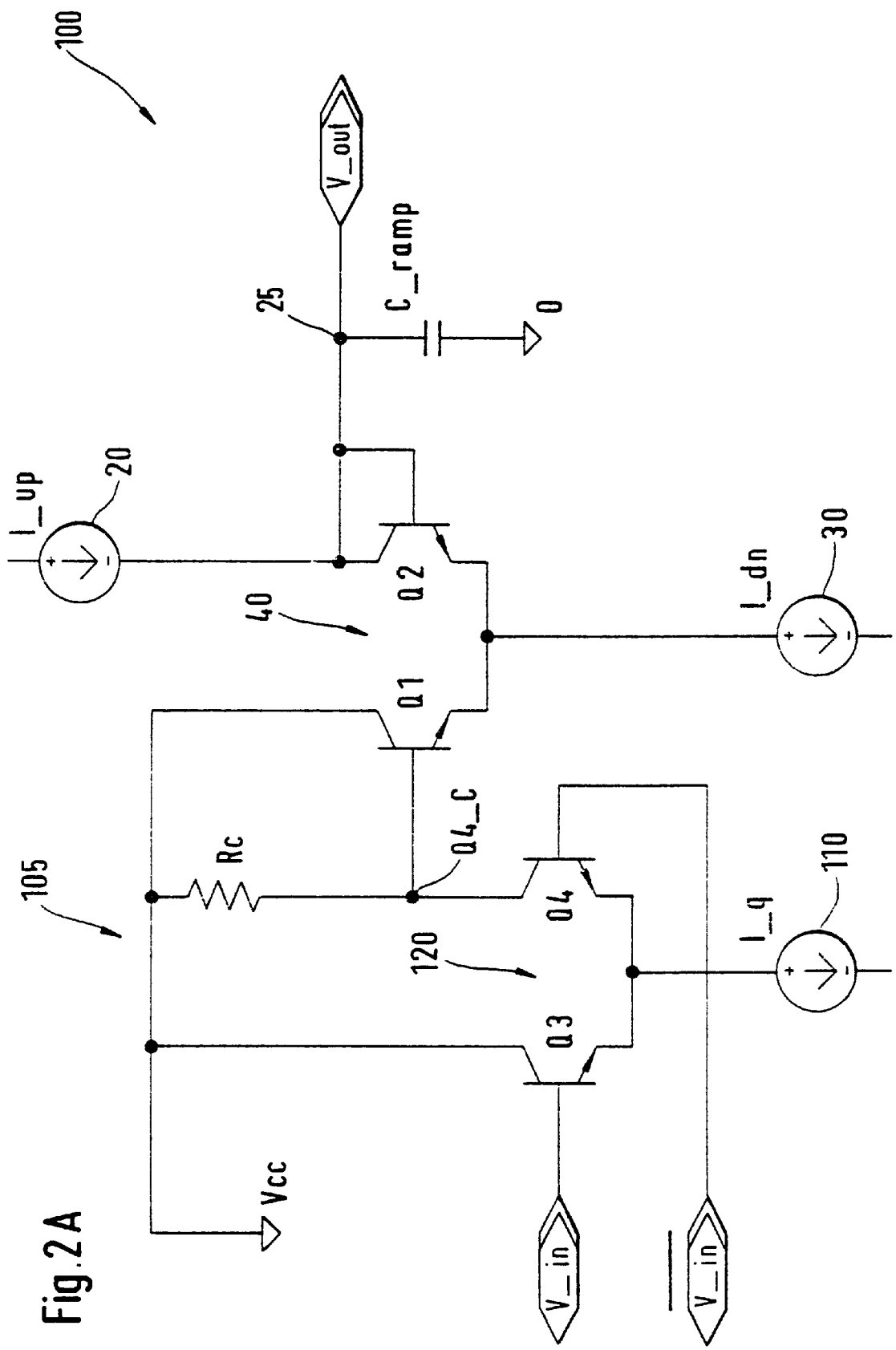
FIG. 2A depicts a first embodiment of a slope generator 100 according to the invention.

FIG. 2A depicts a first embodiment of a slope generator 100 according to the invention. In accordance with the slope generator 10 of FIG. 1, the slope generator 100 comprises the ramp-capacitor C_ramp and the (positive) current source 20 providing the current I_up, both coupled to the node 25. The slope generator 100 further comprises the (negative) current source 30 providing the current I_dn to the current switch 40 consisting of the transistors Q1 and Q2. The current switch 40 is coupled to and controlled by the input signal V_in.

In contrast to the slope generator 10 of FIG. 1, a voltage level generation unit 105 provides the two voltage levels V_h and V_l to the current switch 40. The voltage level generation unit 105 preferably comprises a current switch 120 (consisting of transistors Q3 and Q4) controlling the coupling of a current source 110 providing a current I_q. The current switch 120 generates the two voltage levels V_h and V_l at the collector (node Q4_C) of transistor Q4, following the input signal V_in. The collector of transistor Q4 is coupled to the base of transistor Q1 of the current switch 40. Collector and base of transistor Q2 are commonly coupled to node 25 thus rendering the transistor Q2 to be diode-connected.

Whereas the current switch 40 in FIG. 1 only has the function of switching on or off the current I_dn to node 25, the current switch 40 in FIG. 2A further provides the two voltage levels V_h and V_l to the node 25.

In the example of FIG. 2A, to current source 30 is selected to provide a current I_dn=2×I_up for reasons which become clearer later.

In operation, the slope generator 100 repetitively goes through four different states:

State #1: Low level state
State #2: Transition from low level to high level
State #3: High level state
State #4: Transition back to low level FIG. 2B depicts a diagram of currents and voltages for an example of the slope generator 100 in operation.

State #1: Assuming V_in is at a low level. Transistor Q3 will be turned off and transistor Q4 will be turned on. The collector of Q4 is coupled via an impedance Rc to a potential VCC, preferably ground level, thus generating the first voltage level:

$$V\_l = Vcc - I\_q \times Rc \quad (4a)$$

at the collector of Q4 at node Q4_C. The voltage V_out at the node 25 is at an equilibrium point where no current is flowing into or out of the ramp capacitor C_ramp. The current I_up provided from the current source 20 is forced to flow through the diode-connected transistor Q2. Since the current source 30, coupled to the common emitters of transistors Q1 and Q2, pulls the current I_dn=2×I_up, exactly the same current I_up will flow through the transistor Q2 and the base emitter diode of transistor Q1.

Having identical currents flowing through the base-emitter diodes of the transistors Q1 and Q2, the output voltage V_out at the ramp-node 25 will be determined by the voltage level V_l and the base-emitter voltages Vbe_Q1 of transistor Q1 and Vbe_Q2 of transistor Q2:

$$V\_out = V\_l - Vbe\_Q1(I\_up) + Vbe\_Q2(I\_up) \quad (4b).$$

Assuming a good matching of the transistors Q1 and Q2, the base-emitter voltages Vbe_Q1 and Vbe_Q2 will be substantially identical, thus keeping the output voltage V_out exactly at the voltage level V_l:

$$V\_out = V\_l \quad (4c).$$

State #2: Assuming a fast (relative to the intended slope at node 25) positive transition (from low level to high level) of the input signal V_in. Transistor Q3 will be turned on and transistor Q4 will be turned off, thus generating the second voltage level:

$$V\_h = Vcc \quad (5a)$$

at the collector of transistor Q4. Transistor Q1 will be turned on and transistor Q2 will be turned off (as output voltage V_out at node 25 still is at V_l due to the capacitor C_ramp). Transistor Q1 will provide the full current I_dn, and no current will flow through transistor Q2. This forces the current source 20 to provide the current I_up to the capacitor C_ramp, thus charging the capacitor C_ramp with a current I_ramp=I_up and at a rate of:

$$dV/dt = I\_up / C\_ramp \quad (5b)$$

State #3: As the output voltage V_out is reaching the second voltage level V_h, transistor Q2 will start to turn on, taking over more and more of the current I_up from the current source 20 until a new equilibrium is reached at the ramp node 25. Now again, no current is flowing into or out of the ramp capacitor C_ramp. The current I_up from the current source 20 has to flow through transistor Q2 and, since the current source 30 pulls the current I_dn=2×I_up, the same current I_up will flow through transistor Q1. This, again, keeps the output voltage V_out at the ramp node 25 exactly at the second voltage level V_h.

State #4: Assuming a fast (relative to the intended slope at node 25) negative transition (from high level to low level) of the input signal V_in. Transistor Q3 will be turned off and transistor Q4 will be turned on, thus generating again the first voltage level V_l=VCC−I_q×Rc at the collector of transistor Q4. Transistor Q1 will be turned off and transistor Q2 will be turned on (as the output voltage V_out at node 25 still is at second voltage level V_h due to the capacitor C_ramp). The full current I_dn will be forced through transistor Q2. As I_dn is twice I_up, the effective discharging current through the capacitor C_ramp is −I_up.

Reentering State #1: As the output voltage V_out at node 25 is reaching the first voltage level V_1, transistor Q1 will start to turn on, taking over a part of the current I_dn pulled by the current source 30, until a new equilibrium is reached at the ramp node 25. Now again, no current is flowing into or out of the ramp capacitor C_ramp. The current I_up is forced to flow through transistor Q2, and the same current I_up flows through transistor Q1 (see above), thus keeping the output voltage V_out exactly at the first voltage level V_1.

It is to be understood that the voltage level generation unit 105 comprising the current switch 120 in combination with the current source 110 (providing the current I_q) only represent a preferred embodiment of the invention for providing the two voltage levels V_h and V_1 to the current switch 40. The current switch 120, however, decouples the input and transforms the input signal(s) V_in to the voltage levels V_h and V_1. It is clear that though the input signal is depicted in FIG. 2A as differential input, any kind of input signal (differential or non-differential) can be applied. As an alternative to the current switch 120, a pulse voltage source allowing to switch between the voltage levels V_h and V_1 can also be applied.

Further more, it is clear that the provided current I_dn is only preferably selected to be twice the current I_up. For the embodiments of FIGS. 2A and 3, a certain offset of the voltage levels has to be considered in case that I_dn>I_up, but I_dn 2×I_up, which can be compensated either in the generation of the voltage levels or in the stage following the voltage output. In case that I_dn=2×I_up, the offset voltage at the ramp node 25 is constantly at (V_h+V_1)/2.

Figure 3:
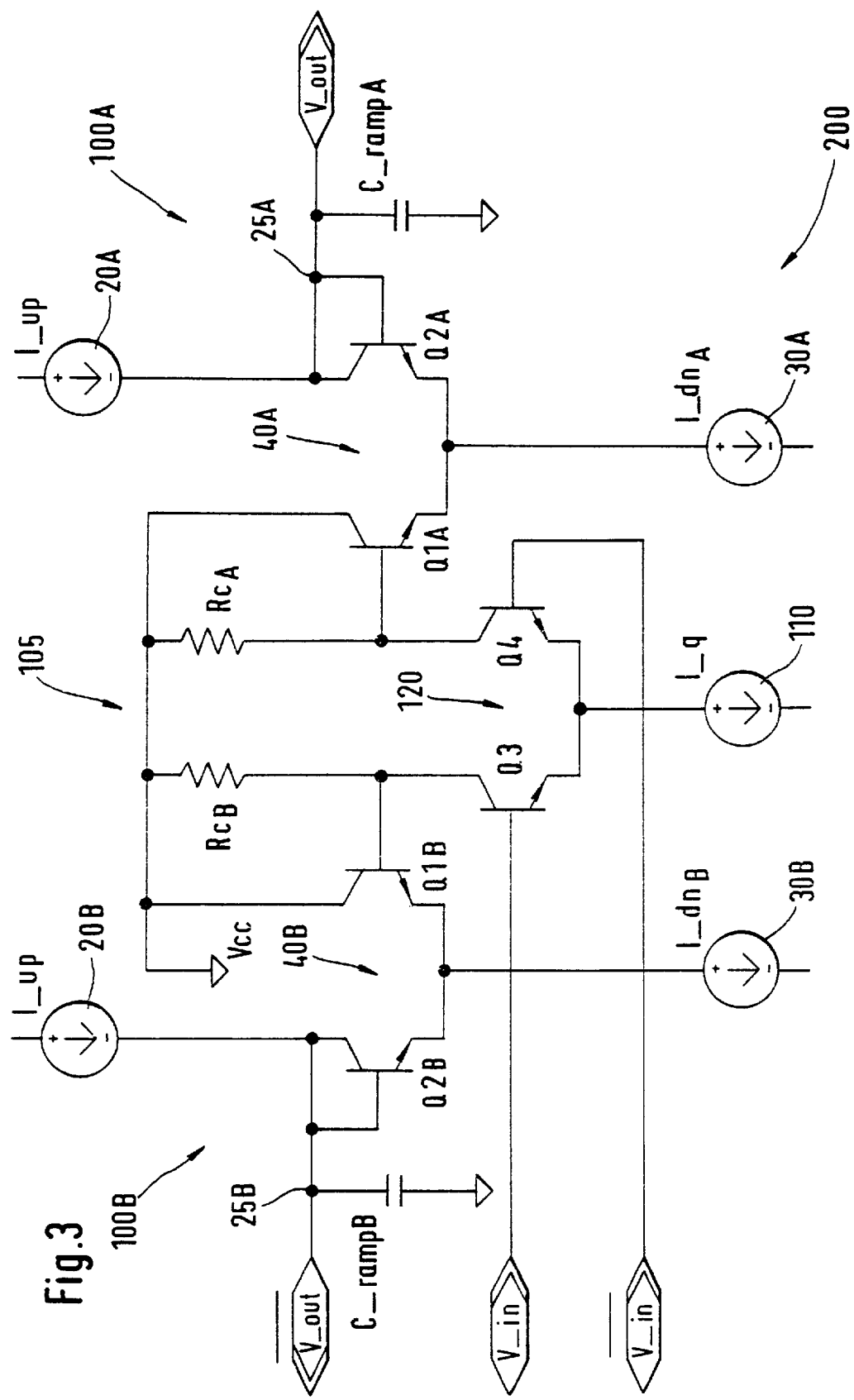
FIG. 3 depicts a second embodiment of a slope generator 200 according to the invention as a differential circuit.

FIG. 3 depicts a second embodiment of a slope generator 200 according to the invention as a fully differential circuit. The differential generation of slopes makes the design less sensitive to common mode effects. The embodiment of FIG. 3 substantially corresponds to the embodiment of FIG. 2A. Components corresponding due to the differential characteristics are denoted with A and B.

The difference between the embodiments of FIGS. 2A and 3 is that in FIG. 3 both the normal and the complementary input signals V_in are fed through separate slope-generators 100A and 100B built up substantially in accordance with the slope generator 100 of FIG. 2. The slope-generators 100A and 100B employ substantially identical capacitors C_rampA and C_rampB and substantially identical charge-/discharge currents. The voltage level generation unit 105 provides the differential voltage levels to the transistors Q1A and Q1B. With a positive step at V_in a positive slope is generated at node 25A via the transistors Q1A and Q2A. At the same time, a negative slope with the substantially identical transition time is generated at node 25B via transistors Q1B and Q2B, thus generating a differential output signal V_out.

What is claimed is:

1. A slope generator for generating, in response to an input signal, a slope between a first and a second voltage level of an output voltage at an output node, the slope generator comprising:

a capacitor coupled to the output node, a first current source for providing a first current to the output node, a first current switch, comprising a first control electrode of a first current path, wherein said first control electrode is coupled to and controlled by the input signal, and a second current path being coupled to the output node, and a second current source for providing a second current to the output node controlled by the first current switch, wherein the first current switch provides the first and the second voltage levels, or corresponding voltage levels derived therefrom, to the output node and the second current is greater than the first current, and wherein a second control electrode of said second current path of said first current switch is coupled to said output node.

2. The slope generator of claim 1, wherein the first current switch comprises two emitter-coupled transistors.

3. The slope generator of claim 2, wherein the second current source is coupled to common emitters of the two transistors of the first current switch.

4. The slope generator of claim 1, wherein the second current is twice the first current.

5. The slope generator of claim 1, further comprising:

a voltage level generation unit for providing the first and the second voltage levels, derived from the input signal, to the control electrode of the first current path of the current switch.

6. The slope generator of claim 5, wherein the voltage level generation unit comprises a second current switch controlling a third current source.

7. The slope generator of claim 1, wherein the capacitor is charged by the first current source for generating a first voltage slope.

8. The slope generator of claim 1, wherein the capacitor is discharged by the second current source for generating a second voltage slope.

* * * * *